United States Patent
Wang et al.

(10) Patent No.: US 12,381,111 B2
(45) Date of Patent: Aug. 5, 2025

(54) WAFER BONDING METHOD AND BONDED WAFER

(71) Applicant: Yangtze Memory Technologies Co., Ltd., Wuhan (CN)

(72) Inventors: Chao Wang, Wuhan (CN); Youdong Jiang, Wuhan (CN); Yulong Zhang, Wuhan (CN); Zhiyong Suo, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 860 days.

(21) Appl. No.: 17/644,135

(22) Filed: Dec. 14, 2021

(65) Prior Publication Data

US 2022/0189822 A1 Jun. 16, 2022

(30) Foreign Application Priority Data

Dec. 14, 2020 (CN) .......................... 202011471584.2

(51) Int. Cl.
*H01L 21/768* (2006.01)
*H01L 23/00* (2006.01)
*H01L 23/538* (2006.01)

(52) U.S. Cl.
CPC .. *H01L 21/76802* (2013.01); *H01L 21/76843* (2013.01); *H01L 21/76877* (2013.01); *H01L 23/5384* (2013.01); *H01L 23/5386* (2013.01); *H01L 24/82* (2013.01); *H01L 2224/82896* (2013.01)

(58) Field of Classification Search
CPC ......... H01L 21/76802; H01L 21/76843; H01L 21/76877; H01L 23/5384; H01L 23/5386; H01L 24/82; H01L 2224/82896
See application file for complete search history.

(56) References Cited

U.S. PATENT DOCUMENTS

| 9,362,717 | B2 * | 6/2016 | Kikuchi | H01L 21/02458 |
| 2006/0099738 | A1 * | 5/2006 | Yamazaki | H01L 21/486 |
| | | | | 257/E27.113 |
| 2006/0162956 | A1 * | 7/2006 | Nakamura | H05K 3/4038 |
| | | | | 174/262 |
| 2013/0230740 | A1 * | 9/2013 | Yanase | H01L 24/11 |
| | | | | 428/675 |
| 2017/0299790 | A1 * | 10/2017 | Ueno | G02B 1/14 |

* cited by examiner

*Primary Examiner* — Zandra V Smith
*Assistant Examiner* — Andre C Stevenson
(74) *Attorney, Agent, or Firm* — Conley Rose, P.C.

(57) ABSTRACT

A method of wafer bonding includes: forming a first hole in a first insulation layer disposed over a first substrate; performing a first deposition-self-etch process to deposit a first conductive material in the first hole to form a first conductive plug; forming a second hole in a second insulation layer disposed over a second substrate; performing a second deposition-self-etch process to deposit a second conductive material in the second hole to form a second conductive plug; and bonding the first conductive plug with the second conductive plug to form a first grain fusion layer between the first conductive plug and the second conductive plug.

7 Claims, 8 Drawing Sheets

WAFER BONDING METHOD AND BONDED WAFER

CROSS-REFERENCE TO RELATED APPLICATION

This application claims priority to Chinese Patent Application No. 202011471584.2, filed on Dec. 14, 2020, the entire content of which is incorporated herein by reference.

TECHNICAL FIELD

The present disclosure relates to the technical field of integrated circuits (ICs) and, more particularly, to a wafer bonding method and a bonded wafer.

BACKGROUND

In three-dimensional (3D) memory technology, a process of achieving interconnection through wafer-to-wafer bonding is used to increase density of the 3D memory. Specifically, a first metal pad on a surface of a first wafer is connected to a second metal pad on a surface of a second wafer, such that the first wafer and the second wafer are bonded to form a bonded wafer.

SUMMARY

One aspect of the present disclosure provides a method of wafer bonding. The method includes: forming a first hole in a first insulation layer disposed over a first substrate; performing a first deposition-self-etch process to deposit a first conductive material in the first hole to form a first conductive plug; forming a second hole in a second insulation layer disposed over a second substrate; performing a second deposition-self-etch process to deposit a second conductive material in the second hole to form a second conductive plug; and bonding the first conductive plug with the second conductive plug to form a first grain fusion layer between the first conductive plug and the second conductive plug.

Another aspect of the present disclosure provides another method of wafer bonding. The method includes: forming a first conductive element in a first insulation layer disposed over a first substrate; forming a first connection layer covering the first conductive element, wherein an average grain size of the first connection layer is not greater than an average grain size of the first conductive element; forming a second conductive element in a second insulation layer disposed over a second substrate; forming a second connection layer covering the second conductive element, wherein an average grain size of the second connection layer is not greater than an average grain size of the second conductive element; and bonding the first connection layer with the second connection layer to form a first grain fusion layer.

Another aspect of the present disclosure provides a bonding wafer. The bonded wafer includes: a first semiconductor structure, including a first substrate, a first insulation layer disposed over the first substrate, a first conductive element disposed in the first insulation layer, and a first connection layer covering the first conductive element; a second semiconductor structure, including a second substrate, a second insulation layer disposed over the second substrate, a second conductive element disposed in the second insulation layer, and a second connection layer covering the second conductive element; and a first grain fusion layer, including a crystal grain fusion of at least a portion of the first connection layer and at least a portion of the second connection layer.

BRIEF DESCRIPTION OF THE DRAWINGS

To more clearly illustrate the technical solution in embodiments of the present disclosure, the accompanying drawings used in the description of the disclosed embodiments are briefly described hereinafter. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Figure 1:
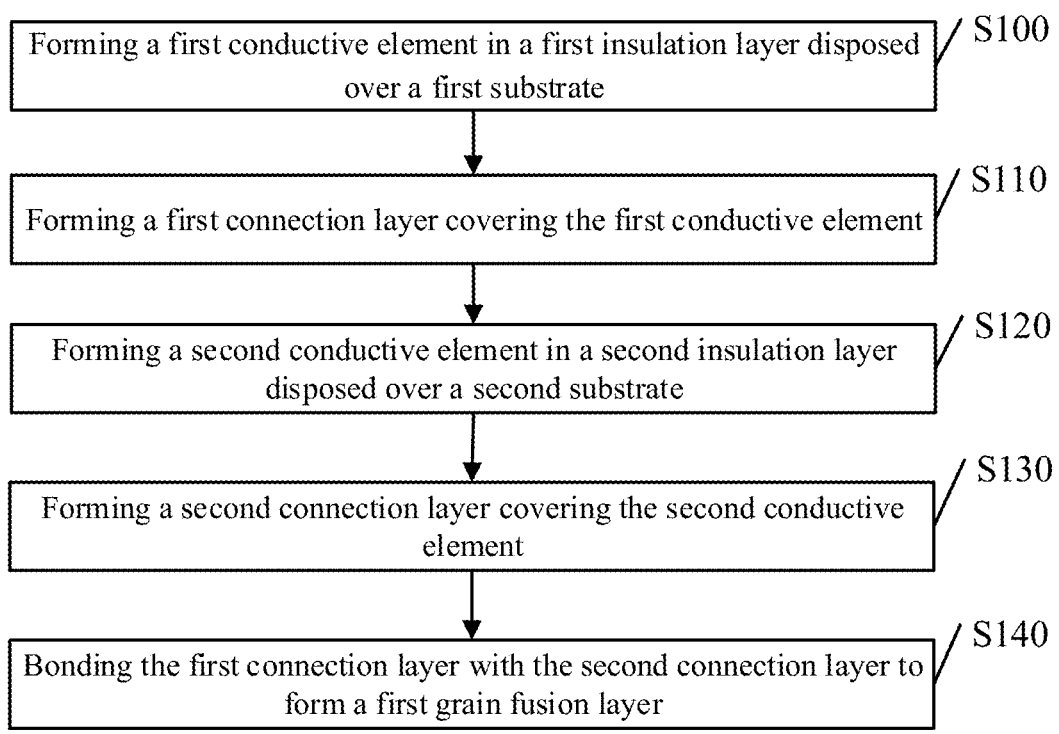
FIG. 1 is a schematic flowchart of an exemplary wafer bonding method according to embodiments of the present disclosure.

Technical solutions in the embodiments of the present disclosure will be clearly described below with reference to the accompanying drawings. Although the accompanying drawings show exemplary implementation methods of the present disclosure, it should be understood that the present disclosure can be implemented in various forms and should not be limited by the embodiments set forth herein. On the contrary, the embodiments are provided to enable a more thorough understanding of the present disclosure and to fully convey the scope of the present disclosure to those skilled in the art.

In the following paragraphs, the present disclosure will be described in more detail with examples and with reference to the accompanying drawings. Advantages and features of the present disclosure will be apparent according to the description and the claims. It should be noted that the accompanying drawings all adopt a simplified form and use imprecise proportions. For convenience and clarity, the drawings are only used to assist in describing objectives of the embodiments of the present disclosure.

In the embodiments of the present disclosure, a sentence like "A and B are connected" includes situations where A and B are connected with each other and are in contact with each other or where A and B are connected through another component and without directly contacting with each other.

In the embodiments of the present disclosure, terms such as "first" and "second" are used to distinguish similar objects and are not necessarily used to describe a specific sequence or order.

In the embodiments of the present disclosure, a term "layer" refers to a material portion including a region having a thickness. A layer may extend over an entirety of a lower or upper structure, or may have a range smaller than that of the lower or upper structure. In addition, the layer may be a region of homogeneous or heterogeneous continuous structure having a thickness smaller than a thickness of the continuous structure. For example, the layer may be disposed between a top surface and a bottom surface of the continuous structure or may be disposed between two planes where the top surface and the bottom surface are located respectively. The layer may extend horizontally, vertically, and/or along an inclined surface. The layer may include a plurality of sub-layers.

It will be appreciated that the described embodiments are some rather than all of the embodiments of the present disclosure. Other embodiments obtained by those having ordinary skills in the art on the basis of the described embodiments without inventive efforts should fall within the scope of the present disclosure.

Embodiments of the present disclosure will be described in detail in connection with the drawings. Under circumstances of no conflict, the following embodiments and features in the embodiments may be combined with each other.

A process of bonding wafers is critical to a yield rate of the bonded wafer. However, the existing technology for bonding the wafers does not provide sufficient grain fusion between two bonded wafers, thereby lowing reliability of the bonded wafer. Thus, it is urgent to solve the reliability problem of bonding wafers.

FIG. 1 is a schematic flowchart of an exemplary wafer bonding method according to embodiments of the present disclosure. As shown in FIG. 1, the method includes the following processes.

At S100, a first conductive element is formed in a first insulation layer disposed over a first substrate.

At S110, a first connection layer is formed to cover the first conductive element. An average grain size of the first connection layer is not greater than an average grain size of the first conductive element.

At S120, a second conductive element is formed in a second insulation layer disposed over a second substrate.

At S130, a second connection layer is formed to cover the second conductive element. An average grain size of the second connection layer is not greater than an average grain size of the second conductive element.

At S140, the first connection layer and the second connection layer are bonded to form a first grain fusion layer.

In some embodiments, the first insulation layer and the second insulation layer are formed separately by a same method. For example, a chemical vapor deposition (CVD) method may be used to form the first insulation layer over the first substrate and form the second insulation layer over the second substrate.

The first insulation layer and the second insulation layer may be made of a same material. For example, the first insulation layer and the second insulation layer may be made of silicon oxide or nitrogen-doped silicon carbide (NDC).

In some embodiments, when the first insulation layer is formed, a first hole may be reserved for forming the first conductive element. At S100, the first hole may be deposited with metal to form the first conductive element.

Similarly, when the second insulation layer is formed, a second hole may be reserved for forming the second conductive element. At S120, the second hole may be deposited with metal to form the second conductive element.

A method of forming the first conductive element at S100 may be the same as a method of forming the second conductive element at S120. For example, a physical vapor deposition (PVD) or a CVD method may be used to form the first conductive element and the second conductive element.

The first conductive element and the second conductive element may be made of a same material. For example, the first conductive element and the second conductive element may be made of copper.

A method of forming the first connection layer at S110 may be the same as a method of forming the second connection layer at S130. For example, a PVD method may be used to form the first connection layer and the second connection layer.

The first connection layer and the second connection layer may be made of a same material. For example, the first connection layer and the second connection layer may be made of copper.

It should be noted that although the first connection layer and the first conductive element may be made of a same material and the second connection layer and the second conductive element may be made of another same material, the first connection layer and the first conductive element may be formed by different methods and the second connection layer and the second conductive element may be formed by different methods, such that an average grain size of the first conductive element is greater than an average grain size of the first connection layer and an average grain size of the second conductive element is greater than an average grain size of the second connection layer.

In some embodiments, grain sizes of the first connection layer and the second connection layer are between 20 nm and 100 nm. For example, the sizes of the first connection layer and the second connection layer are between 20 nm and 30 nm.

The average grain size of the first connection layer may be the same as the average grain size of the second connection layer. Alternatively, the average grain size of the first connection layer may be slightly greater than the average grain size of the second connection layer. Alternatively, the average grain size of the first connection layer may be slightly smaller than the average grain size of the second connection layer. The present disclosure does not limit the average grain sizes thereof.

At S140, the first connection layer and the second connection layer are bonded through a high-temperature bonding method or a high-temperature and high-pressure bonding method to form the first grain fusion layer, thereby achieving wafer bonding.

For example, S140 may include: aligning the first connection layer with the second connection layer to make the first connection layer contact the second connection layer and to make the first insulation layer surrounding the first connection layer contact with the second insulation layer surrounding the second connection layer; and heating the first connection layer and the second connection layer that contact with each other to fuse the crystal grains of the first connection layer and the crystal grains of the second connection layer together at a contact interface or a bond interface and to form the first grain fusion layer.

Due to fusion of the crystal grains in the first grain fusion layer, an average grain size of the first grain fusion layer is greater than the average grain size of the first connection layer, and the average grain size of the first grain fusion layer is greater than the average grain size of the second connection layer.

In some embodiments, the grain size of the first grain fusion layer is between 100 nm and 200 nm. For example, the grain size of the first grain fusion layer is between 90 nm and 110 nm. In some embodiments, the grain size of the first connection layer and the second connection layer is between 20 nm and 100 nm. For example, the grain size of the first connection layer and the second connection layer is between 20 nm and 30 nm.

It should be noted that before the first connection layer and the second connection layer are bonded, a contact interface (also known as a bond interface) between the first connection layer and the second connection layer is coplanar with a contact interface between the first insulation layer and the second insulation layer. After the first connection layer and the second connection layer are bonded, the first connection layer and the second connection layer form an integral structure, and the contact interface or the bond interface between the first connection layer and the second connection layer no longer exists.

In a process of crystal grain fusion, crystal grains absorb energy from ambient environment to regenerate and fuse with adjacent crystal grains. For example, in the high-temperature bonding method, a temperature of a wafer bonding process may be raised to provide more energy to boost the fusion of the crystal grains in the first connection layer and the second connection layer.

In some embodiments, the first conductive element and the second conductive element are directly bonded to form the bonded wafer. Because the average grain size of the first conductive element and the second conductive element (e.g., >200 nm) are relatively large, fusion of the crystal grains at the contact interface between the first conductive element and the second conductive element may be insufficient, such that a bonding structure formed between the first conductive element and the second conductive element includes a crystal grain boundary. The crystal grain boundary basically coincides with the contact interface between the first conductive element and the second conductive element, deteriorates the mechanical and electrical properties of the bonding structure, and makes the bonding between the first conductive element and the second conductive element less reliable.

Because the average grain size of the first connection layer is not greater than the average grain size of the first conductive element and the average grain size of the second connection layer is not greater than the average grain size of the second conductive element, a grain boundary energy of the crystal grains in the first connection layer is higher than a grain boundary energy of the crystal grains in the first conductive element and a grain boundary energy of the crystal grains in the second connection layer is higher than a grain boundary energy of the crystal grains in the second conductive element. As such, a migration rate of the crystal grains at the bonding boundary between the first connection layer and the second connection layer is higher than a migration rate of the crystal grains at the bonding boundary between the first conductive element layer and the second conductive element. Thus, in the wafer bonding process, a probability of crystal grain fusion across the grain boundary is increased and a risk of delamination in a bonding area is reduced.

Therefore, compared with directly bonding the first conductive element and the second conductive element that have relatively large average grain size (e.g., >200 nm) to form the bonded wafer, the embodiments consistent with the present disclosure, through bonding the first connection layer and the second connection layer that have relatively small grain size (e.g., 20 nm to 30 nm), improve efficiency and quality of forming the first grain fusion layer, increase a bonding strength of the bonding interface, reduce a contact resistance of the bonding interface, and provide reliable mechanical and electrical properties of the bonded wafer.

Further, compared with directly bonding the first conductive element and the second conductive element that have relatively large grain size (e.g., >200 nm) to form the bonded wafer, the embodiments consistent with the present disclosure achieve a high efficiency of the crystal grain fusion through bonding the first connection layer and the second connection layer that have relatively small grain size (e.g., 20 nm to 30 nm). Thus, the embodiments consistent with the present disclosure increase the crystal grain fusion at the bonding boundary between the first connection layer and the second connection layer without increasing a thermal budget of the wafer bonding process.

It should be understood that methods of increasing the fusion of the crystal grains by raising a temperature of the wafer bonding process or extending a time interval of the wafer bonding process not only increase the thermal budget or a manufacturing cost of the wafer bonding process, but also provide limited improvement of the fusion of the crystal grains. The embodiments consistent with the present disclosure increase the fusion of the crystal grains and at the same time have minimal impact on the thermal budget and the manufacturing cost.

In some embodiments, forming the first conductive element in the first insulation layer disposed over the first substrate (S100) includes: forming a first hole in the first insulation layer; depositing a first conductive material in the first hole to form the first conductive element that has a height smaller than a height of the first hole, and to form a first groove over the first conductive element in the first insulation layer.

In some embodiments, forming the first connection layer covering the first conductive element (S110) includes: depositing a first connection material in the first groove to form the first connection layer.

In some embodiments, the first hole in the first insulation layer may be formed by a dry etching method.

In a process of depositing the first conductive material in the first hole, a deposition time may be controlled to control a height of the first conductive element, thereby ensuring the height of the first conductive element is not greater than the height of the first hole. As such, a top surface of the formed first conductive element is slightly lower than a top opening of the first hole, thereby forming the first groove.

In some embodiments, forming the first conductive element in the first insulation layer disposed over the first substrate (S100) includes: forming the first hole in the first insulation layer; depositing the first conductive material in the first hole and on the first insulation layer to form a first seed layer; forming a first electroplating layer on the first seed layer; and planarizing the first electroplating layer until the first insulation layer is exposed. In this case, the first seed layer and the first electroplating layer remained inside the first hole form the first conductive element, and a top surface of the first conductive element includes a second groove having a concave surface facing toward the first substrate.

In some embodiments, forming the first connection layer covering the first conductive element (S110) includes: depositing the first connection material in the second groove to form the first connection layer.

For example, when the first conductive element is made of materials including copper, a Damascus process may be used to form the first conductive element that partially fills the first hole.

In some embodiments, at S100, the first seed layer may be formed by a PVD process. In general, the first seed layer is thin. For example, a thickness of the first seed layer ranges from 100 nm to 200 nm. The first conductive material includes copper.

In some embodiments, at S100, the first seed layer may be used as an electrode to form the first electroplating layer by an electroplating process. In this case, an average grain size of the first electroplating layer is greater than an average grain size of the first seed layer.

For example, when the first seed layer and the first electroplating layer include copper, the average grain size of the first seed layer ranges from 20 nm to 30 nm, and the average grain size of the first electroplating layer ranges from 100 nm to 200 nm.

In some embodiments, a ratio of a height of the first hole over a diameter of the first hole is greater than a threshold. For example, the ratio is 100. In this case, the ratio is called a high aspect ratio.

In some embodiments, when the first hole has a high aspect ratio, multiple pairs of the first seed layer and the first electroplating layer are formed to fill the first hole.

In some embodiments, forming the first conductive element in the first insulation layer disposed over the first substrate at S100 includes: forming the first hole in the first insulation layer; repeatedly performing a first deposition-electroplating process to form the first seed layer and the first electroplating layer in the first hole until the first hole is filled, where the first deposition-electroplating process includes depositing the first conductive material in the first hole and on the first insulation layer to form the first seed layer and forming the first electroplating layer on the first seed layer; and planarizing the electroplating layer on the top of the first hole until the first insulation layer is exposed, where multiple pairs of the first seed layer and the first electroplating layer remained inside the first hole form the first conductive element, and a top surface of the first conductive element includes a third groove having a concave surface facing toward the first substrate.

In some embodiments, forming the first connection layer covering the first conductive element at S110 includes: depositing the first connection material in the third groove to form the first connection layer.

In some embodiments, at S100, the first electroplating layer is planarized by a chemical-mechanical polishing (CMP) process.

In some embodiments, the first conductive element formed by planarizing the first electroplating layer forms a dish-shaped third groove on the top of the first conductive element, such that the top surface of the first conductive element is lower than a top surface of the first insulation layer.

In the embodiments of the present disclosure, the first connection layer is formed by filling the third groove generated naturally in the process of forming the first conductive element, thereby improving the bonding quality while being compatible with the existing technology.

In some embodiments, after the first hole is formed and before the first conductive element is formed, a first barrier layer is formed covering a sidewall and a bottom of the first hole. In this case, the first barrier layer is used to prevent particles of the first conductive element from diffusing into the first insulation layer.

In some embodiments, the first barrier layer may be formed by a PVD process. The material of the first barrier layer is selected to work with the material of the first conductive element. For example, the first barrier layer is made of a material including hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof.

For example, when the first conductive element is made of materials including copper, the first barrier layer may be made of materials including tantalum. In another example, when the first conductive element is made of materials including copper, the first barrier layer may further include a double-layer structure including a tantalum sub-layer and a tantalum nitride sub-layer. In this case, the tantalum sub-layer is disposed between the tantalum nitride sub-layer and the first conductive element.

In some embodiments, after the first barrier layer is formed, the first seed layer is formed by a PVD process to cover the first barrier layer.

In some embodiments, the first barrier layer is formed to prevent the particles of the first conductive element from diffusing into the first insulation layer, thereby ensuring desired performance of the bonded wafer.

In some embodiments, the first barrier layer has sufficient adhesion to the first insulation layer and the first conductive element. Thus, the first barrier layer is formed to enhance a mechanical adhesion between the first conductive element and the first insulation layer, thereby improving the mechanical performance and reliability of the bonded wafer.

In some embodiments, a surface of the first connection layer includes a first concave region. A first filling material is formed on the surface of the first connection layer having the first concave region, where the first filling material protrudes from the surface of the first insulation layer. The first filling material is planarized until at least a portion of the first connection layer is exposed, where an average grain size of a first filling layer formed by the remaining first filling material is not greater than the average grain size of the first conductive element after the planarization process. The first filling layer and the second connection layer are bonded together to form a second grain fusion layer.

When surface flatness of the first connective plug is poor and the first connection layer is thin (e.g., the thickness of the first connection layer is 100 nm), the top surface of the first connection layer includes the first concave region after the first connection layer is formed. The first concave region degrades the flatness of the first connection layer, causes a gap between the aligned first connection layer and the second connection layer, and reduces a contact area between the first connection layer and the second connection layer, thereby degrading the quality of the first grain fusion layer.

Further, when the first concave region of the first connection layer is lower than the top surface of the first insulation layer, the first connection layer may be unable to contact the second connection layer, resulting in bonding failure.

When the first filling material is formed on the first connection layer, the first filling material not only fills the first concave region, but also covers flat regions surrounding the first concave region on the first connection layer. Thus, planarizing the first filling material until at least a portion of the first connection layer is exposed facilitates the first filling layer to compensate the first concave region on the first connection layer.

In some embodiments, because the first filling layer is disposed at the first concave region on the first connection layer, in the process of bonding the first connection layer with the second connection layer, the first filling layer directly contacts and bonds with the second connection layer. In other words, the first connection layer that directly contacts with the second connection layer is bonded with the second connection layer, and at the same time, the first filling layer that directly contacts with the second connection layer is bonded with the second connection layer.

In some embodiments, in the process of planarizing the first filling material, shapes of the crystal grains on the surface of the first filling material may be damaged, such that an average grain size of the crystal grains exposed on the surface of the first filling material is not greater than the average grain size of the first conductive element. That is, the average grain size of the first filling layer is not greater than the average grain size of the first conductive element. Thus, bonding the first filling layer with the second connection layer to form the second grain fusion layer ensures the desired bonding strength and reliability of the bonded wafer.

Because the surface flatness of the first connection layer and the surface flatness of the second connection layer substantially affect the quality of the bonded wafer, when the first connection layer includes the first concave region, the embodiments consistent with the present disclosure include forming the first filling layer and using the boundary surface formed jointly by the first filling layer and the first connection layer to bond with the second connection layer, thereby improving the bonding surface flatness of the first substrate and the bonding quality.

In some embodiments, forming the second conductive element in the second insulation layer disposed over the second substrate (S120) includes: forming a second hole in the second insulation layer; depositing a second conductive material in the second hole to form the second conductive element that has a height smaller than a height of the second hole; and forming a fourth groove over the second conductive element in the second insulation layer.

In some embodiments, forming the second connection layer covering the second conductive element (S130) includes depositing a second connection material in the fourth groove to form the second connection layer.

In some embodiments, the second hole in the second insulation layer may be formed by a dry etching process.

In the process of depositing the second conductive material in the second hole, a time interval of depositing the second conductive material in the second hole may be controlled to control a height of the second conductive element to ensure that the height of the second conductive element is not greater than the height of the second hole. As such, the top surface of the second conductive element is slightly lower than the top opening of the second hole to form the fourth groove.

In some embodiments, structures formed on the first substrate and the second substrate include, but are not limited to, the control circuit and the memory array. For example, the control circuit may include a buffer, a voltage regulator, or an amplifier, and the memory array may include a plurality of memory cells arranged in an array. The memory cell includes a non-volatile memory cell (e.g., a 3D NAND memory cell or a phase change memory cell) and/or a volatile memory cell. In some embodiments, the structures formed on the first substrate or the second substrate may further include an alignment mark or a scribe lane.

It should be noted that the embodiments of the present disclosure also apply to bonding at least two substrates including the control circuit or bonding at least two substrates including the memory array.

For example, when bonding two substrates, a first conductive element and a first connection layer are formed on a first substrate, and a second conductive element and a second connection layer are formed on a second substrate. Then, the first substrate and the second substrate are bonded by bonding the first connection layer and the second connection layer.

In some embodiments, forming the second conductive element in the second insulation layer disposed over the second substrate (S120) includes: forming the second hole in the second insulation layer; depositing a second conductive material in the second hole and on the second insulation layer to form a second seed layer; forming a second electroplating layer on the second seed layer; and planarizing the second electroplating layer until the second insulation layer is exposed. In this case, the second seed layer and the second electroplating layer remained inside the second hole form the second conductive element, and a top surface of the second conductive element includes a fifth groove having a concave surface facing toward the second substrate.

In some embodiments, forming the second connection layer covering the second conductive element (S130) includes: depositing a second connection material in the fifth groove to form the second connection layer.

For example, when the second conductive element is made of materials including copper, a Damascus process may be used to form the second conductive element that partially fills the second hole.

In some embodiments, at S120, the second seed layer may be formed by a PVD process. In general, the second seed layer is thin. For example, a thickness of the second seed layer ranges from 100 nm to 200 nm. The second conductive material includes copper.

In some embodiments, at S120, the second seed layer may be used as an electrode to form the second electroplating layer by the electroplating process. In this case, an average grain size of the second electroplating layer is greater than an average grain size of the second seed layer.

For example, when second seed layer and the second electroplating layer include copper, the average grain size of the second seed layer ranges from 20 nm to 30 nm, and the average grain size of the second electroplating layer ranges from 100 nm to 200 nm.

In some embodiments, when the second hole has a high aspect ratio, multiple pairs of the second seed layer and the second electroplating layer are formed to fill the second hole.

In some embodiments, forming the second conductive element in the second insulation layer disposed over the second substrate at S120 includes: forming the second hole in the second insulation layer; repeatedly performing a second deposition-electroplating process to form the second seed layer and the second electroplating layer in the second hole until the second hole is filled, where the second deposition-electroplating process includes depositing the second conductive material in the second hole and on the second insulation layer to form the second seed layer and forming the second electroplating layer on the second seed layer; and planarizing the electroplating layer on the top of the second hole until the second insulation layer is exposed, where multiple pairs of the second seed layer and the second electroplating layer remained inside the second hole form the second conductive element, and a top surface of the second conductive element includes a sixth groove having a concave surface facing toward the second substrate.

In some embodiments, forming the second connection layer covering the second conductive element at S130 includes: depositing the second connection material in the sixth groove to form the second connection layer.

In some embodiments, at S120, the second electroplating layer is planarized by a CMP process.

In some embodiments, the second conductive element formed by planarizing the second electroplating layer forms a dish-shaped sixth groove on the top of the second conductive element, such that the top surface of the second conductive element is lower than a top surface of the second insulation layer.

In the embodiments of the present disclosure, the second connection layer is formed by filling the sixth groove generated naturally in the process of forming the second conductive element, thereby improving the bonding quality while being compatible with the existing technology.

In some embodiments, after the second hole is formed and before the second conductive element is formed, a second barrier layer is formed covering a sidewall and a bottom of the second hole. In this case, the second barrier layer is used to prevent particles of the second conductive element from diffusing into the second insulation layer.

In some embodiments, the second barrier layer may be formed by a PVD process. The material of the second barrier layer is selected to work with the material of the second conductive element. For example, the second barrier layer is made of a material including hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof.

For example, when the second conductive element is made of materials including copper, the second barrier layer may be made of materials including tantalum. In another example, when the second conductive element is made of materials including copper, the second barrier layer may further include the double-layer structure including the tantalum sub-layer and the tantalum nitride sub-layer. In this case, the tantalum sub-layer is disposed between the tantalum nitride sub-layer and the second conductive element.

In some embodiments, after the second barrier layer is formed, the second seed layer is formed by a PVD process to cover the second barrier layer.

In some embodiments, the second barrier layer is formed to prevent the particles of the second conductive element from diffusing into the second insulation layer, thereby ensuring desired performance of the bonded wafer.

In some embodiments, the second barrier layer has sufficient adhesion to the second insulation layer and the second conductive element. Thus, the second barrier layer is formed to enhance the mechanical adhesion between the second conductive element and the second insulation layer, thereby improving the mechanical performance and reliability of the bonded wafer.

In some embodiments, a surface of the second connection layer includes a second concave region. A second filling material is formed on the surface of the second connection layer having the second concave region, where the second filling material protrudes from the surface of the second insulation layer. The second filling material is planarized until at least a portion of the second connection layer is exposed, where an average grain size of a second filling layer formed by the remaining second filling material is not greater than the average grain size of the second conductive element after the planarization process. The second filling layer and the first connection layer are bonded together to form a third grain fusion layer.

When surface flatness of the second connective plug is poor and the second connection layer is thin (e.g., the thickness of the second connection layer is 100 nm), the top surface of the second connection layer includes the second concave region after the second connection layer is formed. The second concave region degrades the flatness of the second connection layer, causes a gap between the aligned first connection layer and the second connection layer, and reduces the contact area between the first connection layer and the second connection layer, thereby degrading the quality of the first grain fusion layer.

Further, when the second concave region of the second connection layer is lower than the top surface of the second insulation layer, the second connection layer may be unable to contact the first connection layer, resulting in bonding failure.

When the second filling material is formed on the second connection layer, the second filling material not only fills the second concave region, but also covers flat regions surrounding the second concave region on the second connection layer. Thus, planarizing the second filling material until at least a portion of the second connection layer is exposed facilitates the second filling layer to compensate the second concave region on the second connection layer.

In some embodiments, because the second filling layer is disposed at the second concave region on the second connection layer, in the process of bonding the first connection layer with the second connection layer, the second filling layer directly contacts and bonds with the first connection layer. In other words, the second connection layer that directly contacts with the first connection layer is bonded with the first connection layer, and at the same time, the second filling layer that directly contacts with the first connection layer is bonded with the first connection layer.

In some embodiments, in the process of planarizing the second filling material, shapes of the crystal grains on the surface of the second filling material may be damaged, such that an average grain size of the crystal grains exposed on the surface of the second filling material is not greater than the average grain size of the second conductive element. That is, the average grain size of the second filling layer is not greater than the average grain size of the second conductive element. Thus, bonding the second filling layer with the first connection layer to form the third grain fusion layer ensures the desired bonding strength and reliability of the bonded wafer.

Because the surface flatness of the first connection layer and the surface flatness of the second connection layer substantially affect the quality of the bonded wafer, when the second connection layer includes the second concave region, the embodiments consistent with the present disclosure include forming the second filling layer and using the boundary surface formed jointly by the second filling layer and the second connection layer to bond with the first connection layer, thereby improving the bonding surface flatness of the second substrate and the bonding quality.

In some embodiments, a first interface is formed jointly by aligning the first filling layer and the first connection layer, and a second interface is formed jointly by aligning the second filling layer and the second connection layer. The first interface and the second interface are bonded to form the first grain fusion layer, the second grain fusion layer, and the third grain fusion layer, thereby forming the bonded wafer.

It should be noted that the first grain fusion layer, the second grain fusion layer, and the third grain fusion layer all are grain fusion layers. The average grain sizes of the three grain fusion layers are substantially the same.

In the embodiments of the present disclosure, the average grain sizes of directly bonded conductive materials are reduced to increase the fusion of the crystal grains. For example, the crystal grains that are completely or partially crossed over in the first and second grain fusion layers are increased from about 15% to about 58%. Thus, the increased fusion of the crystal grains improves efficiency and quality of wafer bonding.

As previously described, when the average grain size (e.g., >200 nm) of the first conductive element and the second conductive element are large, the first connection layer and the second connection layer that have the average grain size (e.g., 20 nm to 30 nm) smaller than the average grain size of the first conductive element and the second conductive element are formed to improve the fusion of the crystal grains. When the first conductive element and the second conductive element can be formed to have the average grain size that is similar to the average grain size (e.g., 20 nm to 30 nm) of the first connection layer and the second connection layer, the first connection layer and the second connection layer are no longer needed, and the first conductive element and the second conductive element can be bonded directly to achieve a bonding performance similar to bonding the first connection layer with the second connection layer. Further, when the first conductive element and the second conductive element can be formed in a single process to obtain a reduced average grain size (e.g., 20 nm to 30 nm), the method of wafer bonding is simplified, the cost of wafer bonding is reduced, and the performance of wafer bonding is uncompromised.

Figure 2:
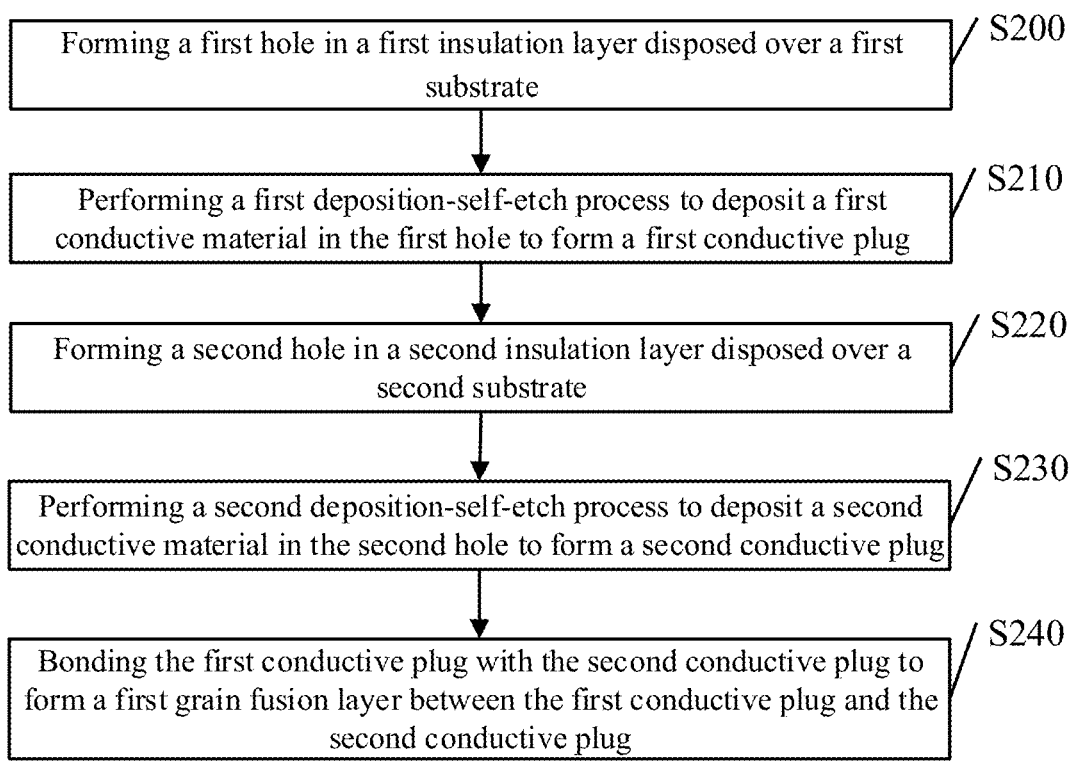
FIG. 2 is a schematic flowchart of another exemplary wafer bonding method according to embodiments of the present disclosure.

The present disclosure also provides another method of wafer bonding. In the method of wafer bonding, because the first conductive element and the second conductive element are formed differently, the first conductive element is referred to as a first conductive plug and the second conductive element is referred to as a second conductive plug. The first conductive plug and the second conductive plug are formed to have the average grain size similar to the average grain size of the first connection layer and the second connection layer, and the first conductive plug and the second conductive plug are bonded directly to achieve the performance of wafer bonding similar to bonding the first connection layer with the second connection layer. FIG. 2 is a schematic flowchart of another exemplary wafer bonding method according to embodiments of the present disclosure. As shown in FIG. 2, the method includes the following processes.

At S200, a first hole is formed in a first insulation layer disposed over a first substrate.

At S210, a first deposition-self-etch process is performed to deposit a first conductive material in the first hole to form a first conductive plug.

At S220, a second hole is formed in a second insulation layer disposed over a second substrate.

At S230, a second deposition-self-etch process is performed to deposit a second conductive material in the second hole to form a second conductive plug.

At S240, the first conductive plug and the second conductive plug are bonded to form a first grain fusion layer between the first conductive plug and the second conductive plug.

In some embodiments, the first insulation layer and the second insulation layer are formed separately by a same method. For example, a CVD method may be used to form the first insulation layer over the first substrate and form the second insulation layer over the second substrate.

The first insulation layer and the second insulation layer may be made of a same material. For example, the first insulation layer and the second insulation layer may be made of silicon oxide or NDC.

In some embodiments, when the first insulation layer is formed, a first hole may be reserved for forming the first conductive plug. At S200, the first hole may be filled with metal to form the first conductive plug.

Similarly, when the second insulation layer is formed, a second hole may be reserved for forming the second conductive plug. At S220, the second hole may be filled with metal to form the second conductive plug.

A method of forming the first hole at S200 may be the same as a method of forming the second hole at S220. For example, a dry etching method may be used to form the first hole and the second hole.

A method of forming the first conductive plug at S210 may be the same as a method of forming the second conductive plug at S230. For example, a PVD method may be used to form the first conductive plug and the second conductive plug.

The first conductive plug and the second conductive plug may be made of a same material. For example, the first conductive plug and the second conductive plug may be made of copper.

It should be noted that the average grain size of the first conductive plug may be the same as the average grain size of the second conductive plug. Alternatively, the average grain size of the first conductive plug may be slightly greater than the average grain size of the second conductive plug. Alternatively, the average grain size of the first conductive plug may be slightly smaller than the average grain size of the second conductive plug. The present disclosure does not limit the average grain sizes thereof.

In some embodiments, at S210 and S230, the first conductive material and the second conductive material include copper. A grain size of the first conductive material and the second conductive material is between 20 nm and 100 nm. For example, the grain size of the first conductive material and the second conductive material is between 20 nm and 30 nm.

In some embodiments, after the first hole and the second hole are formed, a first barrier layer is formed on a sidewall and a bottom of the first hole, and a second barrier layer is formed on a sidewall and a bottom of the second hole. The first barrier layer and the second barrier layer are made of a material including hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof.

In some embodiments, the first barrier layer and the second barrier layer include a tantalum sub-layer and a tantalum nitride sub-layer.

In some embodiments, the deposition-self-etch process includes: a first deposition phase and a second deposition phase. In the first deposition phase, a first bias power is applied at a bottom of the first hole for depositing the first conductive material, and in the second deposition phase, a second bias power is applied for continuously depositing the first conductive material. The second bias power has an absolute value greater than the first bias power and is controlled to allow target material that is accumulated around an opening of the first hole to be bombarded away during the second deposition phase.

In some embodiments, the bias power applied to a wafer is relating to the voltage on the wafer and the current flowing through the element.

In some embodiments, performing the first deposition-self-etch process includes: selecting a deposition process to provide the deposited first conductive material with a reduced grain size of the first conductive material.

In some embodiments, each of the first and second deposition-self-etch processes includes a PVD process, and each of the first and second conductive materials includes copper formed by the PVD process and having a reduced grain size.

Figure 3A:
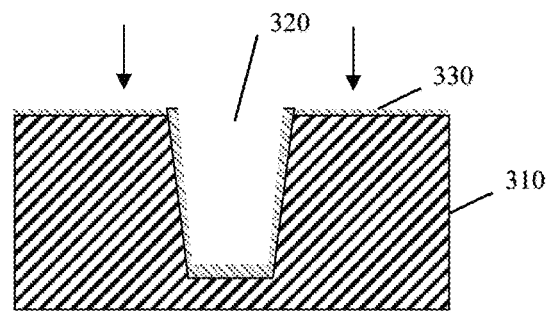
FIGS. 3A-3D are schematic diagrams illustrating an exemplary deposition-self-etch process according to embodiments of the present disclosure.
Figure 3B:
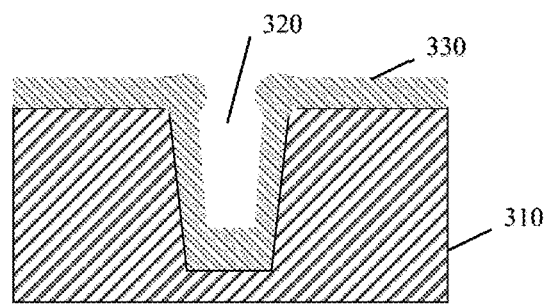

In some embodiments, in the first sputter deposition process, as shown in FIG. 3A, the first conductive material 330 is deposited on the insulation layer 310, and a sidewall and a bottom of the first hole 320. As shown in FIG. 3B, at the first bias power, the first conductive material 330 is accumulated around the opening or an entrance edge of the first hole 320 to reduce an effective area for particles of the first conductive material 330 to enter the first hole.

Figure 3C:
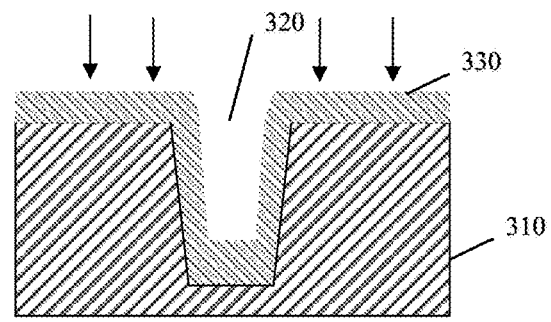

In some embodiments, in the second sputter deposition process, as shown in FIG. 3C, at the second bias power, the particles of the first conductive material 330 bombards toward the first hole 320 at a substantially high speed, such that the first conductive material 330 accumulated at the opening or the entrance edge of the first hole 320 is self-etched by the particles of the first conductive material 330 at the substantially high speed. As such, the opening or the entrance edge of the first hole is opened up as the first conductive material 330 fills the first hole 320.

Figure 3D:
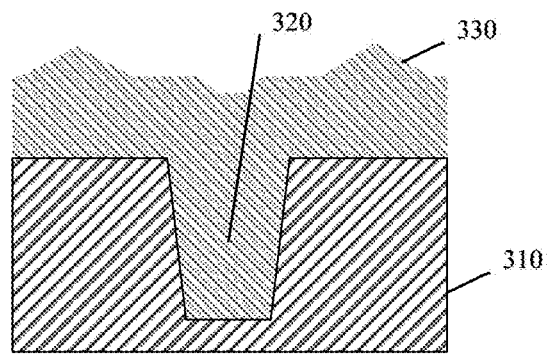

In some embodiments, at S210 and S230, deposition is performed alternately between the first deposition phase and the second deposition phase until the first hole and the second hole are filled completely as shown in FIG. 3D. As such, the first conductive plug and the second conductive plug are formed to have the average grain size (e.g., 20 to 30 nm) that is sufficiently small to achieve the desired performance of wafer bonding.

In some embodiments, in the first deposition phase, the target material is placed at a first distance away from the opening of the first hole to allow the ions of the target material to travel substantially in parallel with the sidewall of the first hole to reach the bottom of the first hole. In the second deposition phase, the target material is placed at a second distance close to the opening of the first hole to allow the ions of the target material to hit the sidewall around the opening of the first hole. The first distance is greater than the second distance.

In some embodiments, a direct current (DC) power or voltage applied at the target material is set to increase a ratio of positive ions in sputtered ions of the target material. In some embodiments, the DC power applied at the target material can be greater than 30,000 watts. The positive ions are accelerated to the substantially high speed by the first bias power and the second bias power applied at the bottom of the first hole and the second hole. In some embodiments, the first bias power and the second bias power can be alternating current power. In some embodiments, the first bias power can be no greater than 200 watts, and the second bias power can be greater than 700 watts.

In the embodiments of the present disclosure, the average grain sizes of directly bonded conductive materials are reduced to increase the fusion of the crystal grains. For example, the crystal grains that are completely or partially crossed over in the first and second grain fusion layers are increased further to about 64%. Further, intermediate layers between the first conductive plug and the second conductive plug are eliminated. Thus, the increased fusion of the crystal grains improves efficiency and quality of wafer bonding, and the elimination of the intermediate layers simplifies the process of wafer bonding and reduces the cost of wafer bonding.

Figure 4:
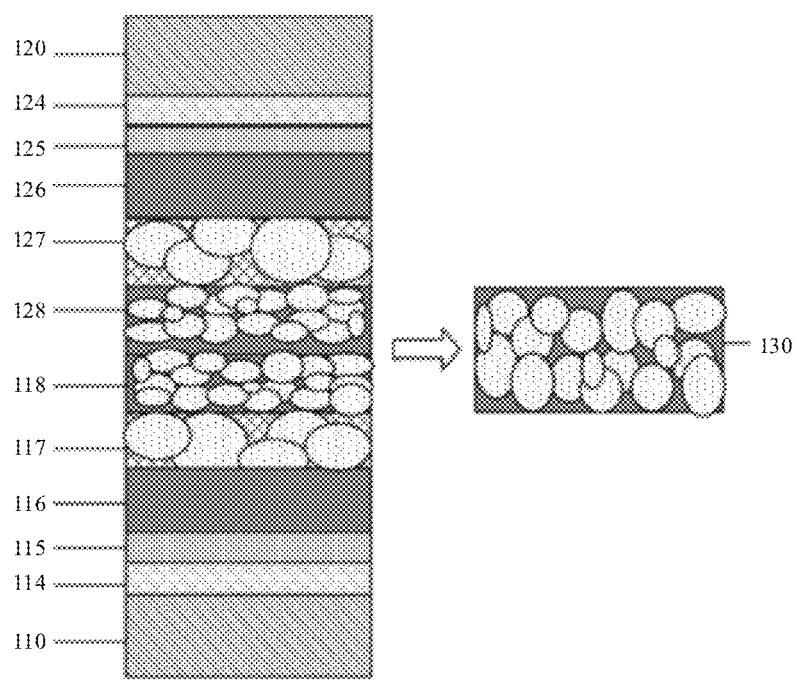
FIG. 4 is a schematic diagram illustrating forming an exemplary grain fusion layer according to embodiments of the present disclosure.

FIG. 4 is a schematic diagram illustrating forming an exemplary first grain fusion layer 130 according to embodiments of the present disclosure. Referring to FIG. 4, the bonded wafer includes a first substrate 110, a first tantalum nitride layer 114, a first tantalum layer 115, a first seed layer 116, a first electroplating layer 117, a first connection layer 118, a second substrate 120, a second tantalum nitride layer 124, a second tantalum layer 125, a second seed layer 126, a second electroplating layer 127, and a second connection layer 128. In the process of bonding the first connection layer 118 and the second connection layer 128, the crystal grains of the first connection layer 118 and the crystal grains of the second connection layer 128 undergo fusion growth to form the integral first grain fusion layer 130, thereby achieving bonding between the first substrate and the second substrate.

Figure 5:
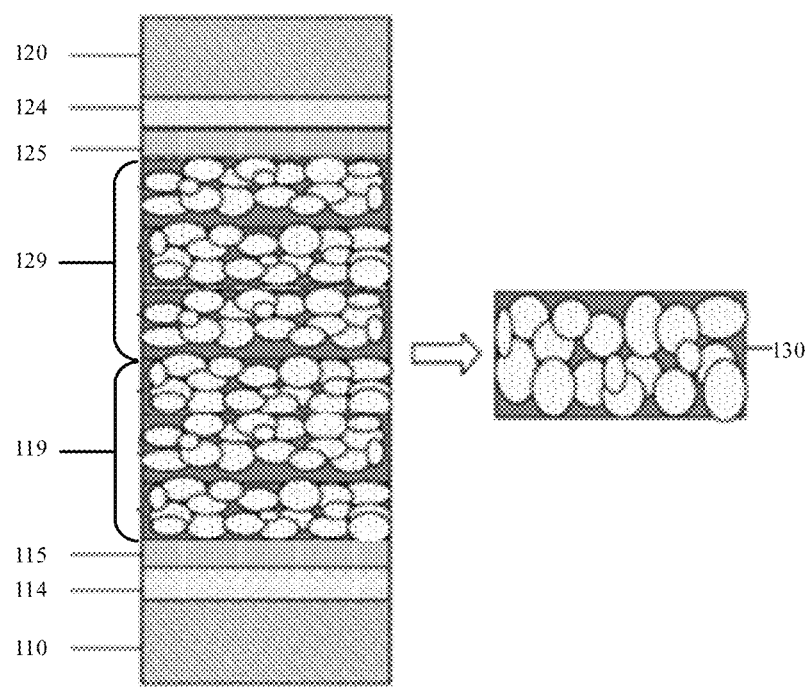
FIG. 5 is a schematic diagram illustrating forming another exemplary grain fusion layer according to embodiments of the present disclosure.

FIG. 5 is a schematic diagram illustrating forming another exemplary first grain fusion layer 130 according to embodiments of the present disclosure. Referring to FIG. 5, the bonded wafer includes a first substrate 110, a first tantalum nitride layer 114, a first tantalum layer 115, a first conductive plug 119, a second substrate 120, a second tantalum nitride layer 124, a second tantalum layer 125, and a second conductive plug 129. In the process of bonding the first conductive plug 119 and the second conductive plug 129, the crystal grains of the first conductive plug 119 and the crystal grains of the second conductive plug 129 undergo fusion growth to form the integral first grain fusion layer 130, thereby achieving bonding between the first substrate and the second substrate.

Figure 6:
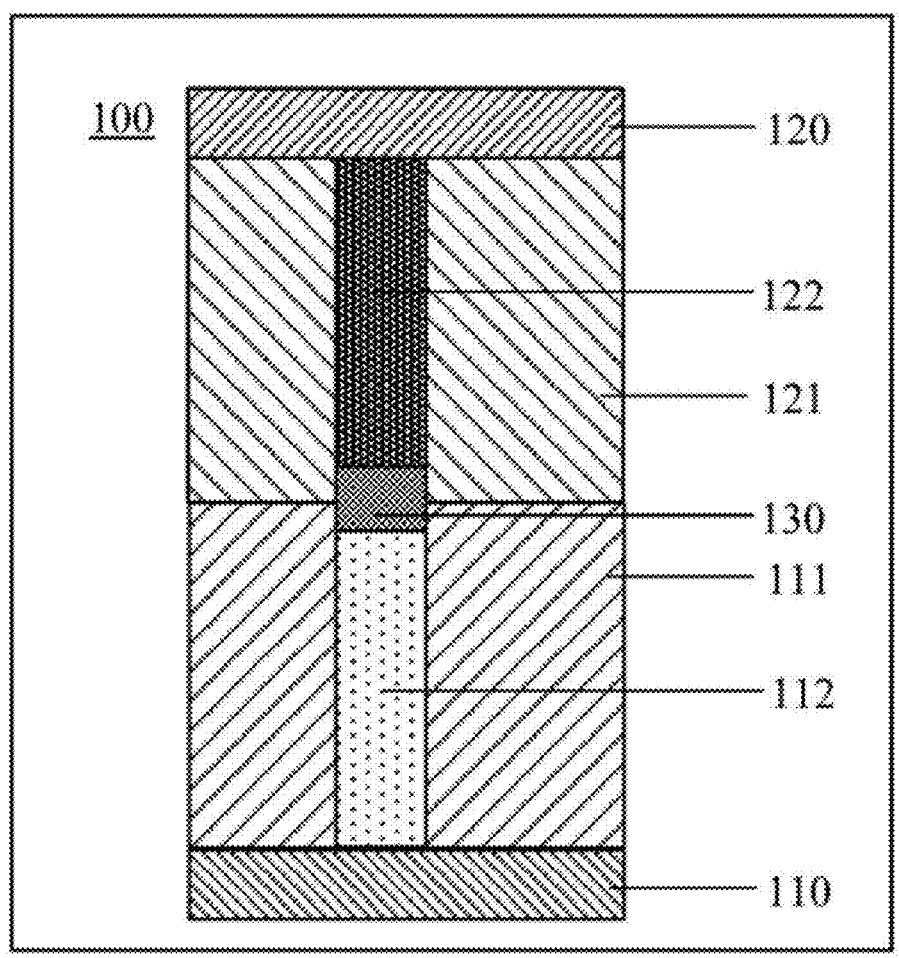
FIG. 6 is a schematic diagram illustrating an exemplary bonded wafer according to embodiments of the present disclosure.

FIG. 6 is a schematic diagram illustrating an exemplary bonded wafer 100 according to embodiments of the present disclosure. The bonded wafer 100 may be formed by the method provided by the embodiments of the present disclosure. Referring to FIG. 6, the bonded wafer 100 includes: a first semiconductor structure, a second semiconductor structure, and a first grain fusion layer 130.

In some embodiments, the first semiconductor structure includes a first substrate 110, a first insulation layer 111 disposed over the first substrate 110, and a first conductive plug 112 disposed in the first insulation layer 111. The second semiconductor structure includes a second substrate 120, a second insulation layer 121 disposed over the second substrate 120, and a second conductive plug 122 disposed in the second insulation layer 121. The first grain fusion layer 130 is coupled to the first conductive plug 112 and the second conductive plug 122, respectively, to bond the first substrate 110 and the second substrate 120. The first grain fusion layer 130 is formed by bonding the first conductive plug 112 and the second conductive plug 122.

In some embodiments, the first conductive plug and/or the second conductive plug are copper seed layers having the grain size range from 20 nm to 30 nm.

In some embodiments, the first semiconductor structure includes a first substrate 110, a first insulation layer 111 disposed over the first substrate 110, a first conductive element 112 disposed in the first insulation layer 111, and a first connection layer (not shown) covering the first conductive element 112. The second semiconductor structure includes a second substrate 120, a second insulation layer 121 disposed over the second substrate 120, a second conductive plug 122 disposed in the second insulation layer 121, and a second connection layer (not shown) covering the second conductive element 122. The first grain fusion layer 130 is coupled to the first connection layer and the second connection layer, respectively, to bond the first substrate 110 and the second substrate 120. The first grain fusion layer 130 is formed by bonding the first connection layer and the second connection layer. The average grain size of the first connection layer is not greater than the average grain size of the first conductive element 112, and the average grain size of the second connection layer is not greater than the average grain size of the second conductive element 122.

The first substrate 110 and the second substrate 120 may be made of materials such as silicon, germanium, or silicon-on-insulator, etc.

In some embodiments, structures formed on the first substrate and the second substrate include, but are not limited to, the control circuit and the memory array. For example, the control circuit may include a buffer, a voltage regulator, or an amplifier, and the memory array may include a plurality of memory cells arranged in an array. The memory cell includes a non-volatile memory cell (e.g., a 3D NAND memory cell or a phase change memory cell) and/or a volatile memory cell. In some embodiments, the structures formed on the first substrate or the second substrate may further include an alignment mark or a scribe lane.

It should be noted that the embodiments of the present disclosure also apply to bonding at least two substrates including the control circuit or bonding at least two substrates including the memory array.

In some embodiments, the first substrate includes a control circuit that is coupled to the first conductive element. The second substrate includes a memory array that is coupled to the second conductive element. The control circuit on the first substrate is configured to control the memory array on the second substrate through the first conductive element and the second conductive element at least bonded by the first grain fusion layer.

The first conductive plug 112 and the second conductive plug 122 may be made of a same material. For example, the first conductive plug 112 and the second conductive plug 122 may be made of a material, such as copper or copper-aluminum alloy.

The first connection layer and the second connection layer may be made of a same material. For example, the first connection layer and the second connection layer may be made of a material, such as copper or copper-aluminum alloy.

It should be noted that although the first connection layer and the first conductive element 112 may be made of a same material and the second connection layer and the second conductive element 122 may be made of another same material, the embodiments of the present disclosure may use different processes to form the first connection layer and the first conductive element 112 to ensure that the average grain size of the first conductive element 112 is greater than the average grain size of the first connection layer, and use different processes to form the second connection layer and the second conductive element 122 to ensure that the average grain size of the second conductive element 122 is greater than the average grain size of the second connection layer.

Because the average grain size of the first connection layer is not greater than the average grain size of the first conductive element 112 and the average grain size of the second connection layer is not greater than the average grain size of the second conductive element 122, a grain boundary energy of the crystal grains in the first connection layer is higher than a grain boundary energy of the crystal grains in the first conductive element 112 and a grain boundary energy of the crystal grains in the second connection layer is higher than a grain boundary energy of the crystal grains in the second conductive element 122. As such, a migration rate of the crystal grains at the bonding boundary between the first connection layer and the second connection layer is higher than a migration rate of the crystal grains at the bonding boundary between the first conductive element 112 and the second conductive element 122. Thus, in the wafer bonding process, a probability of crystal grain fusion across the grain boundary is increased and a risk of delamination in a bonding area is reduced.

Therefore, compared with directly bonding the first conductive element 112 and the second conductive element 122 that have relatively large grain sizes (e.g., >200 nm) to form the bonded wafer, the embodiments of the present disclosure, through bonding the first connection layer and the second connection layer that have relatively small grain sizes (e.g., 20 nm to 30 nm), improve efficiency and quality of forming the first grain fusion layer 130, increase a bonding strength of the bonding interface, reduce a contact resistance of the bonding interface, and provide reliable mechanical and electrical properties of the bonded wafer 100.

Further, compared with directly bonding the first conductive element 112 and the second conductive element 122 that have relatively large grain sizes (e.g., >200 nm) to form the bonded wafer, the embodiments of the present disclosure achieve a high efficiency of the crystal grain fusion through bonding the first connection layer and the second connection layer that have relatively small grain sizes (e.g., 20 nm to 30 nm). Thus, the embodiments of the present disclosure increase the crystal grain fusion at the bonding boundary between the first connection layer and the second connection layer without increasing a thermal budget of the wafer bonding process.

In some embodiments, the bonded wafer 100 further includes a second grain fusion layer (not shown). The second grain fusion layer is formed by bonding the first filling layer filling the first concave region on the surface of the first connection layer with the second connection layer. The average grain size of the first filling layer is not greater than the average grain size of the first connection layer.

Because the surface flatness of the first connection layer substantially affects the quality of the bonded wafer, when the first connection layer includes the first concave region, the embodiments of the present disclosure include forming the first filling layer and using the boundary surface formed jointly by the first filling layer and the first connection layer to bond with the second connection layer, thereby improving the bonding surface flatness of the first substrate 110 and the bonding quality.

In some embodiments, the bonded wafer 100 further includes a third grain fusion layer. The third grain fusion layer is formed by bonding the second filling layer filling the second concave region on the surface of the second connection layer with the first connection layer. The average grain size of the second filling layer is not greater than the average grain size of the second connection layer.

Because the surface flatness of the second connection layer substantially affects the quality of the bonded wafer, when the second connection layer includes the second concave region, the embodiments of the present disclosure include forming the second filling layer and using the boundary surface formed jointly by the second filling layer and the second connection layer to bond with the first connection layer, thereby improving the bonding surface flatness of the second substrate 120 and the bonding quality.

In some embodiments, the first conductive element 112 further includes a first seed layer and a first electroplating layer. The first seed layer is disposed between the first electroplating layer and the first insulation layer 111. The second conductive element 122 further includes a second seed layer and a second electroplating layer. The second seed layer is disposed between the second electroplating layer and the second insulation layer 121.

The first seed layer and the first electroplating layer are made of a same material, and the second seed layer and the second electroplating layer are made of another same material. When the first seed layer and the first electroplating layer are made of the same material, the first seed layer and the first electroplating layer have different grain sizes. When the second seed layer and the second electroplating layer are made of another same material, the second seed layer and the second electroplating layer have different grain sizes.

For example, when the first seed layer and the first electroplating layer include copper, the average grain size of the first seed layer ranges from 20 nm to 30 nm, and the average grain size of the first electroplating layer ranges from 100 nm to 200 nm.

When the second seed layer and the second electroplating layer include copper, the average grain size of the second seed layer ranges from 20 nm to 30 nm, and the average grain size of the second electroplating layer ranges from 100 nm to 200 nm.

Figure 7:
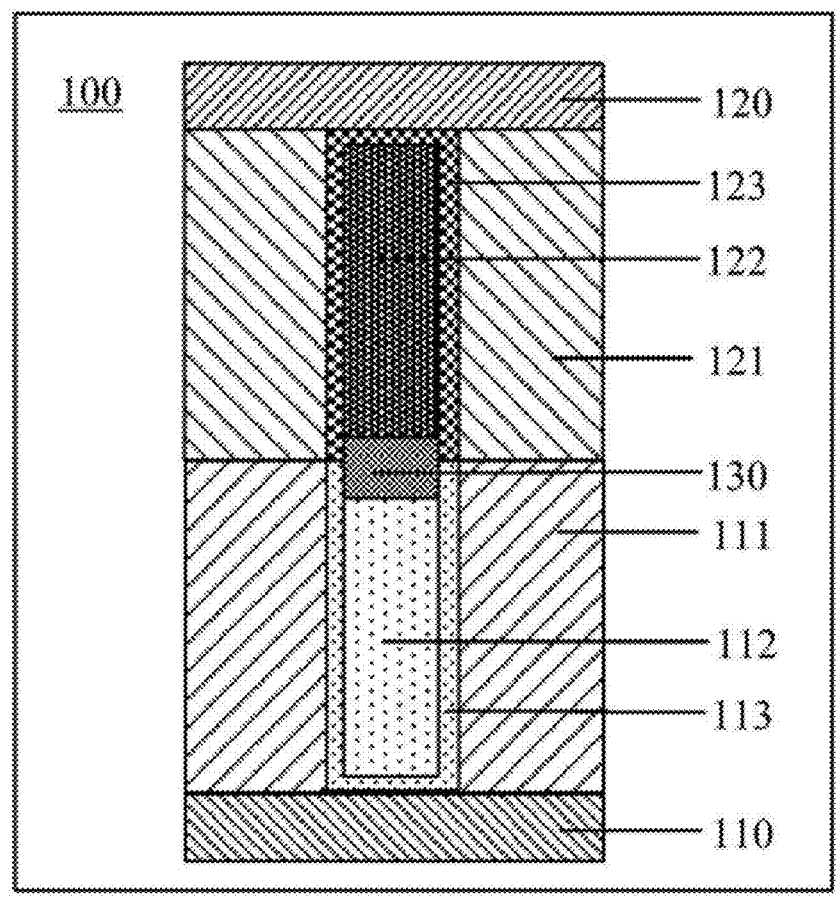
FIG. 7 is a schematic diagram illustrating another exemplary bonded wafer according to embodiments of the present disclosure.

In some embodiments, referring to FIG. 7, the bonded wafer 100 further includes a first barrier layer 113 disposed between a first conductive plug 112 and a first insulation layer 111 to prevent particles of the first conductive plug 112 from diffusing into the first insulation layer 111.

For example, when the first conductive plug 112 is made of a material including copper, the first barrier layer 113 is made of another material including tantalum.

In another example, when the first conductive plug 112 is made of a material including copper, the first barrier layer 113 includes a double-layer structure including a tantalum sub-layer and a tantalum nitride sub-layer. The tantalum sub-layer is disposed between the tantalum nitride sub-layer and the first conductive plug 112.

In some embodiments, the first barrier layer has sufficient adhesion to the first insulation layer 111 and the first conductive plug 112. Thus, the first barrier layer is formed to enhance a mechanical adhesion between the first conductive plug 112 and the first insulation layer 111, thereby improving the mechanical performance and reliability of the bonded wafer 100.

In some embodiments, referring to FIG. 6, the bonded wafer 100 further includes a second barrier layer 123 disposed between a second conductive plug 122 and a second insulation layer 121 to prevent particles of the second conductive plug 122 from diffusing into the second insulation layer 121.

For example, when the second conductive plug 122 is made of a material including copper, the second barrier layer 123 is made of another material including tantalum.

In another example, when the second conductive plug 122 is made of a material including copper, the second barrier layer 123 includes a double-layer structure including a tantalum sub-layer and a tantalum nitride sub-layer. The tantalum sub-layer is disposed between the tantalum nitride sub-layer and the second conductive plug 122.

In some embodiments, the second barrier layer has sufficient adhesion to the second insulation layer 121 and the second conductive plug 122. Thus, the second barrier layer is formed to enhance a mechanical adhesion between the second conductive plug 122 and the second insulation layer 121, thereby improving the mechanical performance and reliability of the bonded wafer 100.

In some embodiments, structures formed on the first substrate and the second substrate include, but are not limited to, the control circuit and the memory array. For example, the control circuit may include a buffer, a voltage regulator, or an amplifier, and the memory array may include a plurality of memory cells arranged in an array. The memory cell includes a non-volatile memory cell (e.g., a 3D NAND memory cell or a phase change memory cell) and/or a volatile memory cell. In some embodiments, the structures formed on the first substrate or the second substrate may further include an alignment mark or a scribe lane.

It should be noted that the embodiments of the present disclosure also apply to bonding at least two substrates including the control circuit or bonding at least two substrates including the memory array.

In some embodiments, the first substrate includes a control circuit that is coupled to the first conductive element. The second substrate includes a memory array that is coupled to the second conductive element. The control circuit on the first substrate is configured to control the memory array on the second substrate through the first conductive element and the second conductive element at least bonded by the first grain fusion layer.

In the embodiments of the present disclosure, the average grain sizes of directly bonded conductive materials are reduced to increase the fusion of the crystal grains. For example, the crystal grains that are completely or partially crossed over in the first and second grain fusion layers are increased to between about 58% and about 64%. Thus, the increased fusion of the crystal grains improves efficiency and quality of wafer bonding.

The foregoing embodiments describe in detail the objective, the technical solution, and the beneficial effect of the present disclosure. The foregoing embodiments are only some of the embodiments of the present disclosure, which should not be used to limit the scope of present disclosure. Therefore, changes, equivalent replacements, and modifications made according to the claims of the present disclosure still fall within the scope of the present disclosure.

What is claimed is:
1. A bonded wafer, comprising:
a first semiconductor structure, including a first substrate, a first insulation layer disposed over the first substrate, a first conductive element disposed in the first insulation layer, and a first connection layer covering the first conductive element;
a second semiconductor structure, including a second substrate, a second insulation layer disposed over the second substrate, a second conductive element disposed in the second insulation layer, and a second connection layer covering the second conductive element; and
a first grain fusion layer, including a crystal grain fusion of at least a portion of the first connection layer and at least a portion of the second connection layer, wherein the first connection layer is made of a first connection material having a grain size smaller than a first conductive material of the first conductive element.

2. The bonded wafer according to claim 1, wherein:
the second connection layer is made of a second connection material having a grain size smaller than a second conductive material of the first conductive element.

3. The bonded wafer according to claim 2, wherein:
a grain size of the first connection material and the second connection material is between 20 nm and 100 nm; and
a grain size of the first grain fusion layer is between 100 nm and 200 nm.

4. The bonded wafer according to claim 1, further comprising a second grain fusion layer, wherein:
the second grain fusion layer is formed by bonding a first filling layer filling a first concave region on a top surface of the first connection layer with the second connection layer; and
an average grain size of the first filling layer is not greater than an average grain size of the first conductive element.

5. The bonded wafer according to claim 1, further comprising a third grain fusion layer, wherein:
the third grain fusion layer is formed by bonding the first connection layer with a second filling layer filling a second concave region on a top surface of the second connection layer; and
an average grain size of the second filling layer is not greater than an average grain size of the second conductive element.

6. The bonded wafer according to claim 1, further comprising:
a first barrier layer disposed between the first conductive element and the first insulation layer to prevent particles of the first conductive element from diffusing into the first insulation layer; and
a second barrier layer disposed between the second conductive element and the second insulation layer to prevent particles of the second conductive element from diffusing into the second insulation layer.

7. The bonded wafer according to claim 1, wherein:
the first substrate includes a control circuit that is coupled to the first conductive element;
the second substrate includes a memory array that is coupled to the second conductive element; and
the control circuit on the first substrate is configured to control the memory array on the second substrate through the first conductive element and the second conductive element at least bonded by the first grain fusion layer.

* * * * *